(12) United States Patent
Yajima et al.

(10) Patent No.: US 8,486,547 B2
(45) Date of Patent: Jul. 16, 2013

(54) ELECTRONIC DEVICE AND BATTERY PACK

(75) Inventors: Takayuki Yajima, Nagano (JP); Keiichi Komaki, Tokyo (JP); Norio Fujimori, Tokyo (JP); Tsuyoshi Ookubo, Nagano (JP)

(73) Assignee: Sony Corporation, Tokyo (JP)

( * ) Notice: Subject to any disclaimer, the term of this patent is extended or adjusted under 35 U.S.C. 154(b) by 1978 days.

(21) Appl. No.: 10/999,509

(22) Filed: Nov. 30, 2004

(65) Prior Publication Data

US 2005/0136320 A1    Jun. 23, 2005

(30) Foreign Application Priority Data

Dec. 1, 2003    (JP) ................................. 2003-401774

(51) Int. Cl.
*H01M 2/00* (2006.01)
*H01M 2/10* (2006.01)
*H01M 6/42* (2006.01)

(52) U.S. Cl.
USPC .............................. 429/61; 429/100; 429/149

(58) Field of Classification Search
USPC ........................................... 429/61, 100, 149
See application file for complete search history.

(56) References Cited

U.S. PATENT DOCUMENTS

| | | | |
|---|---|---|---|
| 5,458,991 A * | 10/1995 | Severinsky | 429/61 |
| 5,646,508 A | 7/1997 | Van Phuoc et al. | |
| 5,962,157 A | 10/1999 | Kang | |
| 6,274,266 B1 * | 8/2001 | Wang | 429/163 |

FOREIGN PATENT DOCUMENTS

| | | |
|---|---|---|
| CN | 1158012 A | 8/1997 |
| CN | 1326192 A | 12/2001 |
| EP | 0 665 628 A2 | 8/1995 |
| EP | 0 707 350 A1 | 4/1996 |
| JP | 03-249581 | 11/1991 |
| JP | 2002-055730 | 2/2002 |
| JP | 2003-259191 | 9/2003 |
| JP | 2003-308082 | 10/2003 |
| WO | WO 98/10610 | 3/1998 |

OTHER PUBLICATIONS

European Patent Office Communication pursuant to Article 94(3) EPC issued Jun. 26, 2012, in European Patent Application No. 04 257 380.8.

* cited by examiner

*Primary Examiner* — Patrick Ryan
*Assistant Examiner* — Julian Anthony
(74) *Attorney, Agent, or Firm* — Oblon, Spivak, McClelland, Maier & Neustadt, L.L.P.

(57) ABSTRACT

An electronic device includes a storing unit which is provided on a battery pack and which retains power information of the battery pack, an acquiring unit which is provided in the main unit and which acquires the power information of the battery pack from the storing unit, and a control unit which is provided in the main unit and which controls the operation of the main unit based on the power information of the battery pack.

11 Claims, 11 Drawing Sheets

ELECTRONIC DEVICE AND BATTERY PACK

BACKGROUND OF THE INVENTION

1. Field of the Invention

The present invention relates to an electronic device and a battery pack provided therein. More specifically, the present invention relates to a technology that optimizes operation control by acquiring power information of a battery pack.

2. Description of the Related Art

Electronic devices include a type of device in which a main unit including various circuits, such as a driving circuit and a control circuit, is equipped with a battery pack and the main unit is driven by electric power supplied from the battery pack. The type of device is, for example, an information processing device such as a personal computer.

This type of electronic device of the related art includes a device (e.g., Japanese Unexamined Patent Application Publication No. 2003-259191) which detects the type and voltage of an installed battery pack and an ambient temperature around the battery pack, and which controls the device operation in response to the detected battery pack type and voltage, and ambient temperature.

Due to the sophistication, etc., of electronic devices in recent years, the maximum power consumption tends to increase in some types of electronic devices. In some cases, there is a possibility that power consumption may exceed the power that can be supplied of a battery pack. Such an excess power consumption over the power that can be supplied of the battery pack may cause the power to unintentionally and suddenly turn off. The power-off may cause a problem of data loss in, for example, an information processing device such as a personal computer.

Accordingly, in order to prevent the above problem from occurring, in the information processing device of the related art, such as a personal computer, a control circuit provided in a main unit, such as a power saving circuit, measures power supplied from a battery pack to the main unit at the time the power consumption exceeds a power threshold set beforehand, and controls the power of a central processing unit (CPU).

In the case of preventing the unintentional sudden power-off by using the power saving circuit or the like, a problem occurs in that the production cost is increased by the need for the power saving circuit or the like.

When power information of the main unit or the battery pack is changed, a parameter of the power saving circuit must be examined and reset each time.

In addition, it is possible to increase the number of cells in the battery pack in order to cope with a rise in power consumption of the electronic device. However, an increased number of cells enlarges the battery pack, thus increasing the battery pack weight. This also causes a problem of requiring major design changes of the battery installation part in which the battery pack is installed.

SUMMARY OF THE INVENTION

It is an object of the present invention to provide an electronic device and a battery pack which overcome the above problems and which optimize operation control.

According to an aspect of the present invention, an electronic device driven by power supplied from a battery pack installed in a main unit of the electronic device is provided. The electronic device includes a storing unit, provided in the battery pack, for storing power information of the battery pack, an acquiring unit, provided in the main unit, for acquiring the power information of the battery pack, and a control unit, provided in the main unit, for controlling the operation of the main unit based on the power information of the battery pack acquired by the acquiring unit.

According to the present invention, the power can be prevented from unintentionally and suddenly turning off due to insufficiency of the power that can be supplied.

In addition, it is not necessary to provide a main unit of an electronic device with a control circuit such as a power saving circuit. This can reduces the cost required for producing the electronic device.

Preferably, the power information of the battery pack is regularly stored by the storing unit, and the regularly stored power information is continuously or intermittently acquired by the acquiring unit.

According to the present invention, operation control can be optimized in response to a state of use on each occasion.

According to another aspect of the present invention, an electronic device driven by power supplied from a battery pack installed in a main unit of the electronic device is provided. The battery pack has thereon a detectable part for enabling detection of the type of the battery pack. The main unit has thereon a detecting part for reading the detectable part to detect the type of the battery pack, and the main unit includes a control unit for controlling the operation of the main unit based on power information stored in the battery pack, whose type is detected.

According to the present invention, a different type of battery pack can be prevented from being mistakenly inserted.

Preferably, a housing for the battery pack has, on an outer surface thereof, one of a detectable projection and a detectable recess as the detectable part, and the main unit has, thereon, as the detecting part, one of a detecting recess into which the detectable projection is to be inserted and a detecting projection to be inserted into the detectable recess.

According to another aspect of the present invention, a battery pack for use in an electronic device including a detecting part for detecting the type of the battery pack and control unit for performing operation control based on power information stored in the battery pack, whose type is detected, is provided. The battery pack supplies driving power to a main unit of the electronic device when being installed in the main unit of the electronic device. The battery pack is provided with a detectable part by which the type of the battery pack is detected such that the detectable part is read by the detecting part when the battery pack is installed in the main unit of the electronic device.

Preferably, a housing for the battery pack has, on an outer surface thereof, one of a detectable projection or a detectable recess as the detectable part, and the type of the battery pack is detected such that a detecting projection provided as the detecting part of the main unit of the electronic device is inserted into the detectable recess, or the detectable projection is inserted into a detecting recess provided as the detecting part of the main unit of the electronic device.

According to the present invention, it is ensured that the above simplified structure can prevent a battery pack from being mistakenly inserted.

DESCRIPTION OF THE PREFERRED EMBODIMENTS

Figure 1:
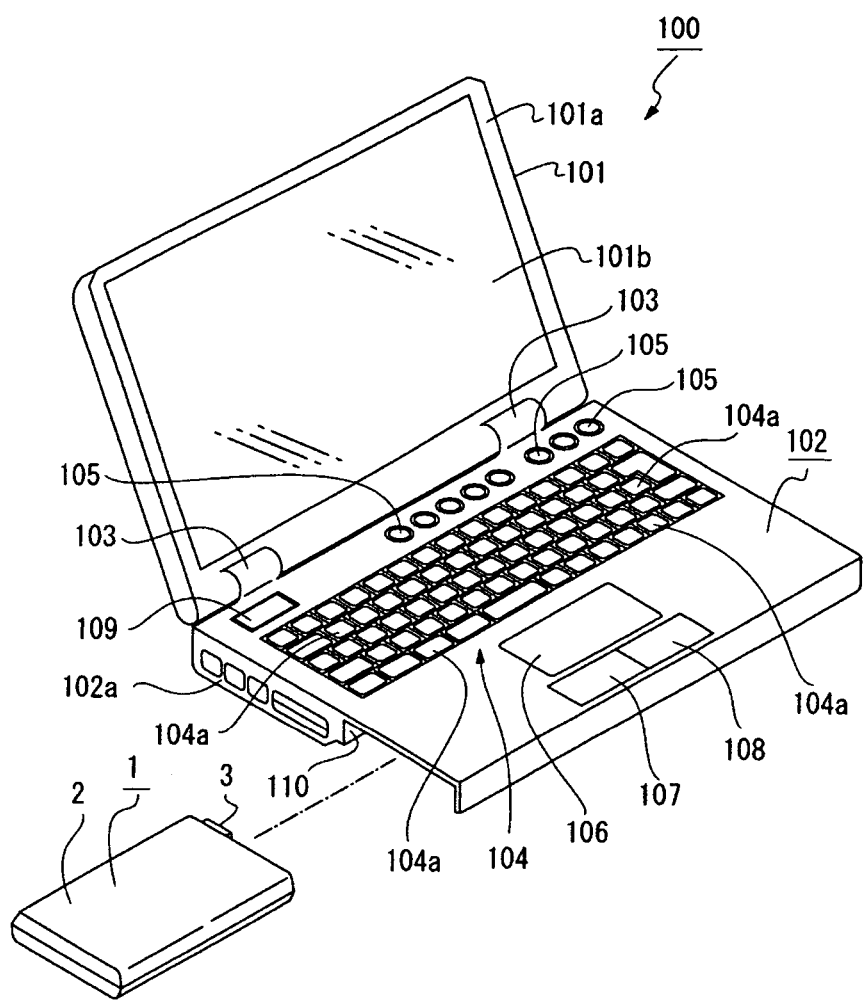
FIG. 1 is a perspective view of an electronic device in a state in which a battery pack is separated from a main unit.

Preferred embodiments of the present invention are described below with reference to the accompanying drawings. The following preferred embodiments are applications of an electronic device and battery pack of the present invention to a personal computer and a battery pack provided therein. The coverage of the present invention is not limited to a personal computer and a battery pack provided therein. The present invention is widely applicable to, for example, various types of electronic devices such as personal digital assistants (PDA), network terminals, portable information terminals, workstations, and audio devices, and battery packs provided therein.

At first, an outline of an electronic device (personal computer) is described below with reference to FIGS. 1 and 2.

An electronic device (personal computer) 100 has a display unit 101 and a main unit 102.

The display unit 101 has a display housing 101a and a display section 101b fixed to the display housing 101a.

Hinge projections 103 which project upward are provided at right and left ends of a rear-end part of the main unit 102. The display unit 101 is rotatably supported by the hinge projections 103.

An oblong keyboard 104 is provided on the top surface of the main unit 102. The keyboard 104 has a plurality of predetermined operation keys 104a thereon. In the main unit 102, a processor, such as a central processing unit (CPU), which is described later, is provided. The processor performs processing on a signal input by an operation on each of the operation keys 104a.

On the top surface of the main unit 102, operating devices different from the operation keys 104a, for example, so-called "hotkeys" 105 in each of which a one-touch operation enables execution of software, a pointing device 106 on which a movement or the like of a pointer on the display section 101b can be performed by applying a force in an arbitrary direction with a finger, a left button 107 and a right button 108 which correspond to two buttons of a mouse, etc., are arranged.

A power-on button 109 is disposed on the top surface of the main unit 102.

Figure 3:
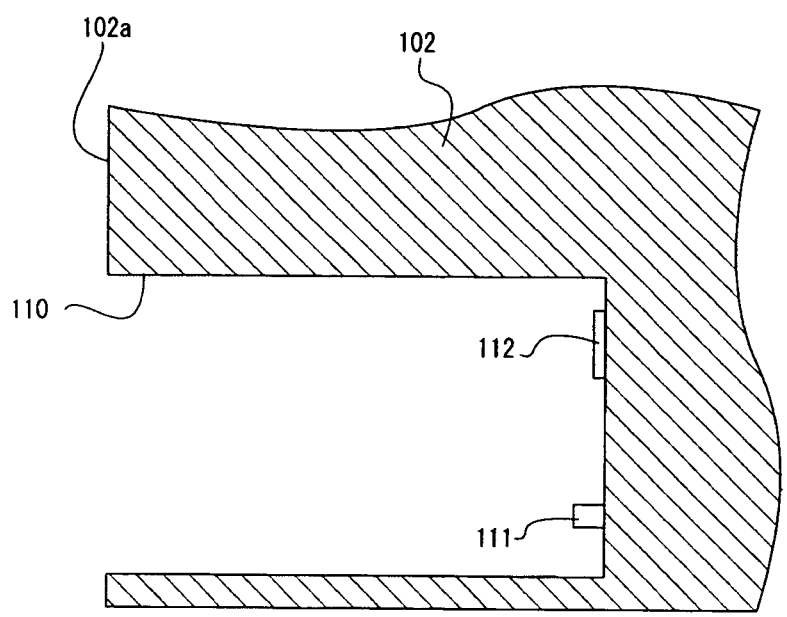
FIG. 3 is a conceptual diagram of the battery installation part of the main unit.

A side face 102a of the main unit 102 has, for example, a recess which opens on the left and bottom of the main unit 102. This recess is used as a battery installation part 110. As FIG. 3 shows, the battery installation part 110 has a detecting projection 111 which projects to the left and which functions as a detector, and a connector 112.

Figure 4:
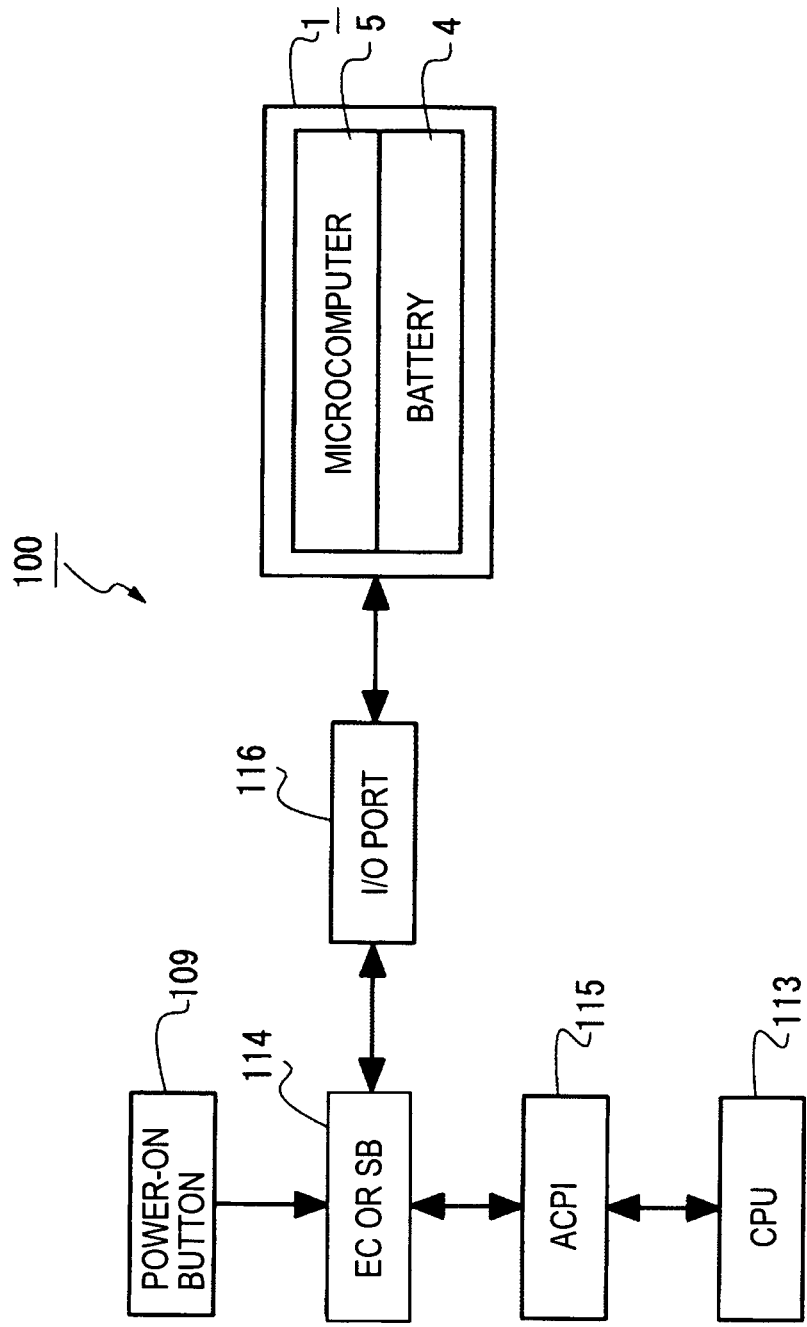
FIG. 4 is a schematic block diagram showing the configuration of the electronic device shown in FIG. 1.

Referring to FIG. 4, the main unit 102 includes a control unit 113 for performing operation control of the main unit 102, a volatile storage unit functioning as a main storage, a nonvolatile storage unit functioning as an auxiliary storage, and an acquiring unit 114. These units are connected by power lines.

The control unit 113 is, for example, a CPU, and has functions of loading stored information into the volatile storage, performing various types of arithmetic processing, and writing the results of the processing in the volatile storage unit.

The volatile storage unit is, for example, a dynamic random access memory (DRAM), and is a memory in which stored information vanishes when power is removed.

The nonvolatile storage unit is, for example, a hard disk drive, an optical disk drive, or the like, and is a memory in which stored information is stored even when power is removed.

The acquiring unit 114 is, for example, an embedded controller (EC) or a south bridge (SB) on a mother board. The acquiring unit 114 has functions, such as detection and acquisition of a connection status of the battery pack to the main unit 102, and a function of controlling the electronic device 100 and each unit of a peripheral device of the electronic device 100 and controlling additional functions, etc. Accordingly, the acquiring unit 114 performs power supply and cutoff for the control unit 113, the volatile storage unit, the nonvolatile storage unit, the mouse used as an input unit, the keyboard 104, the display section 101b used as an output unit, a printer, etc.

The acquiring unit 114 is connected to the power-on button 109, and has a function of detecting an operation on the power-on button 109 and initiating activation of the electronic device 100.

The main unit 102 is provided with an ACPI (Advanced Configuration and Power Interface) 115 as a software layer. The ACPI is a specification for consolidating control of power management of the electronic device 100. The ACPI 115 is an interface unit forming an ACPI mechanism.

Next, the battery pack for use in the electronic device 100 is described with reference to FIGS. 4 and 5.

Figure 5:
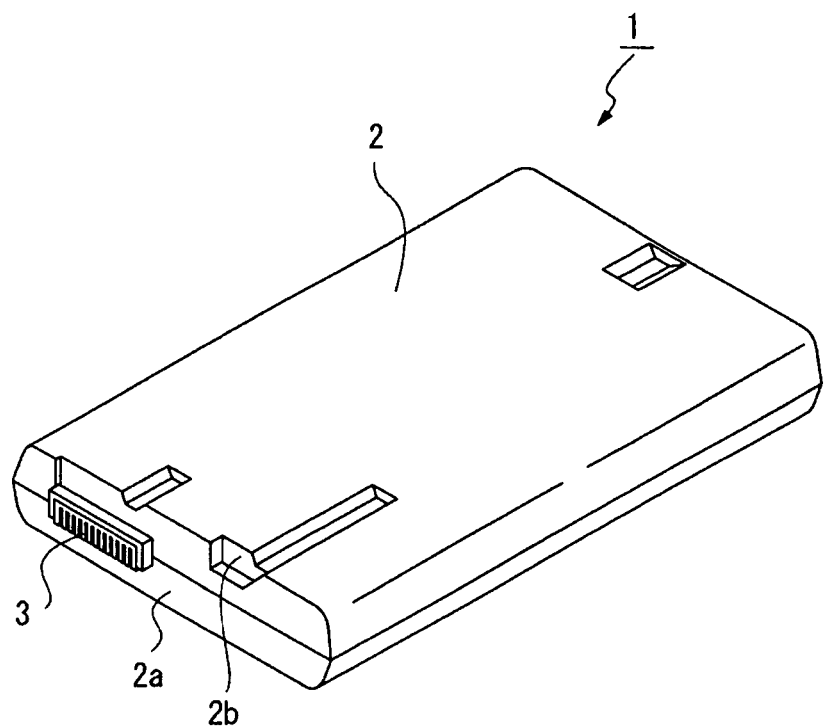
FIG. 5 is an enlarged perspective view of a battery pack.

As shown in FIG. 5, a battery pack 1 has, for example, a substantially rectangular flat form. Inside a housing 2, a plurality of cells 4 (shown in FIG. 4), for example, secondary cells such as lithium-ion cells or ion-polymer cells, and predetermined portions such as a control circuit substrate, are arranged.

A connector 3 is provided on one side face 2a of the housing 2. A detectable recess 2b that functions as a portion to be detected is formed on the side face 2a of the housing 2.

As shown in FIG. 4, the battery pack 1 includes a storing unit 5. The storing unit 5 is, for example, a microcomputer. The storing unit 5 retains various types of information concerning cells 4, such as environmental conditions such as temperature and humidity, power-supply states such as battery's remaining capacity and a load status, a deterioration state, and power information. Accordingly, the storing unit 5 constantly detects power information of the cells 4 and also functions as a power information detecting unit.

The cells 4 and storing unit 5 of the battery pack 1 and each unit of the main unit 102 are connected to one another by a system bus.

As is described later, when the battery pack 1 is installed in the main unit 102, the storing unit 5 is connected to the acquiring unit 114 by an input/output (I/O) port 116.

Figure 6:
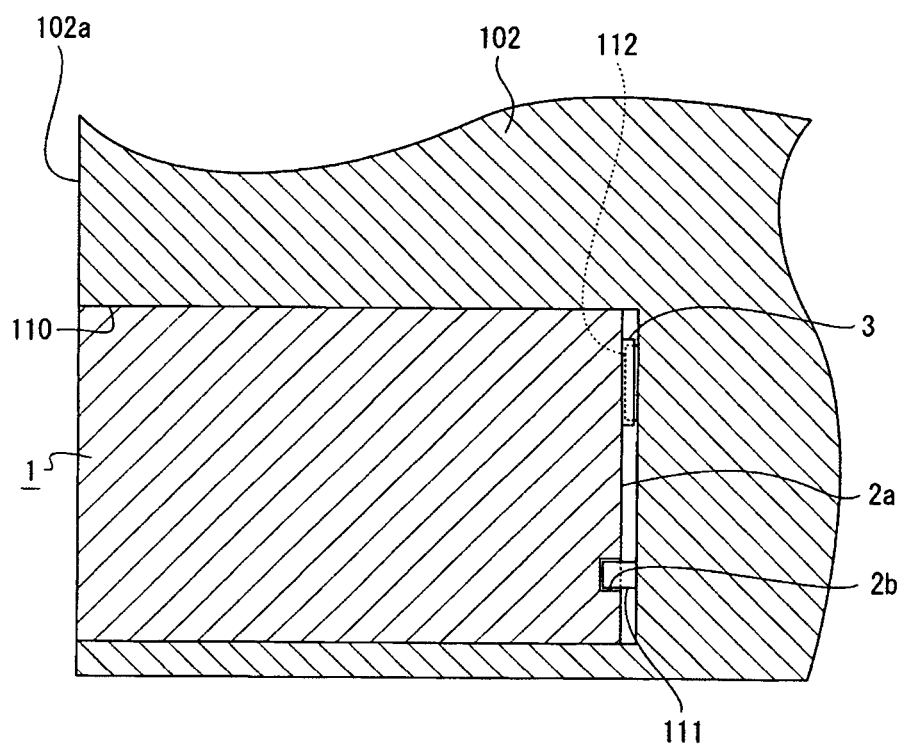
FIG. 6 is a conceptual diagram of a state in which a battery pack is installed in a battery installation part.

The operation of setting the battery pack 1 in the battery installation part 110 is described below with reference to FIGS. 6 to 8.

Setting of the battery pack 1 in the battery installation part 110 is performed by inserting the battery pack 1 into the battery installation part 110 so that the connector 3 is directed to the battery installation part 110. When the battery pack 1 is inserted into the battery installation part 110 to its innermost portion, the detecting projection 111 of the main unit 102 is relatively inserted into the detectable recess 2b of the battery pack 1, as shown in FIG. 6.

When the detecting projection 111 is inserted into the detectable recess 2b, the battery pack 1 is inserted into an innermost end of the battery installation part 110. Then, the connector 3 is connected to a connector 112 of the main unit 102, whereby setting of the battery pack 1 in the battery installation part 110 is completed. After completing the setting of the battery pack 1 in the battery installation part 110, by supplying power to the main unit 102, the I/O port 116 displays a mechanical identification (ID) of the battery pack 1.

As described above, the detectable recess 2b is formed on the battery pack 1. Thus, insertion of the detecting projection 111 into the detectable recess 2b enables setting of the battery pack 1 in the battery installation part 110.

Figure 2:
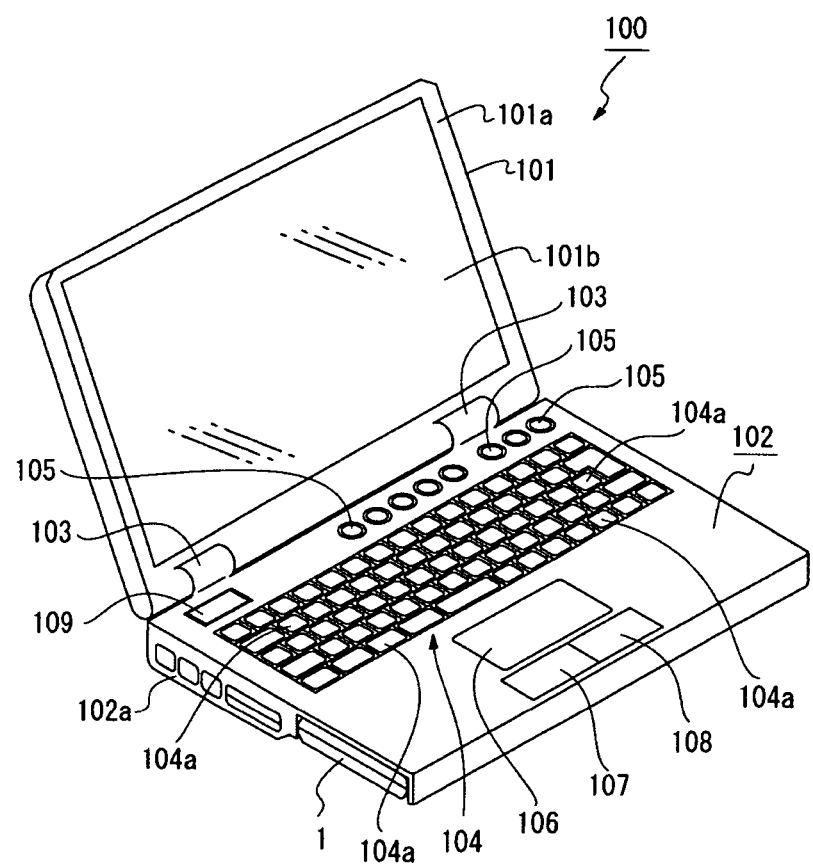
FIG. 2 is a perspective view of the electronic device (shown in FIG. 1) in a state in which the battery pack is installed in the main unit.
Figure 7:
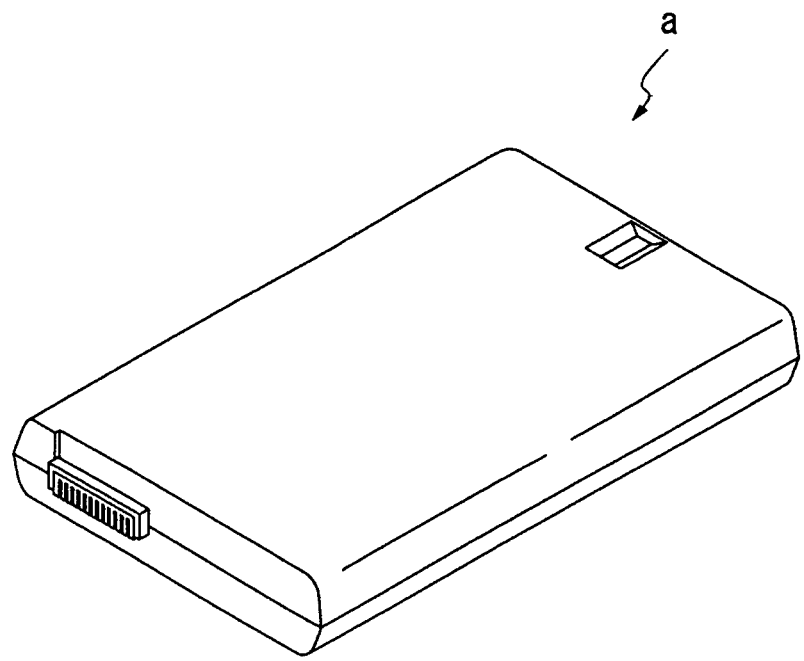
FIG. 7 is an enlarged perspective view of a battery pack having no detectable recess.
Figure 8:
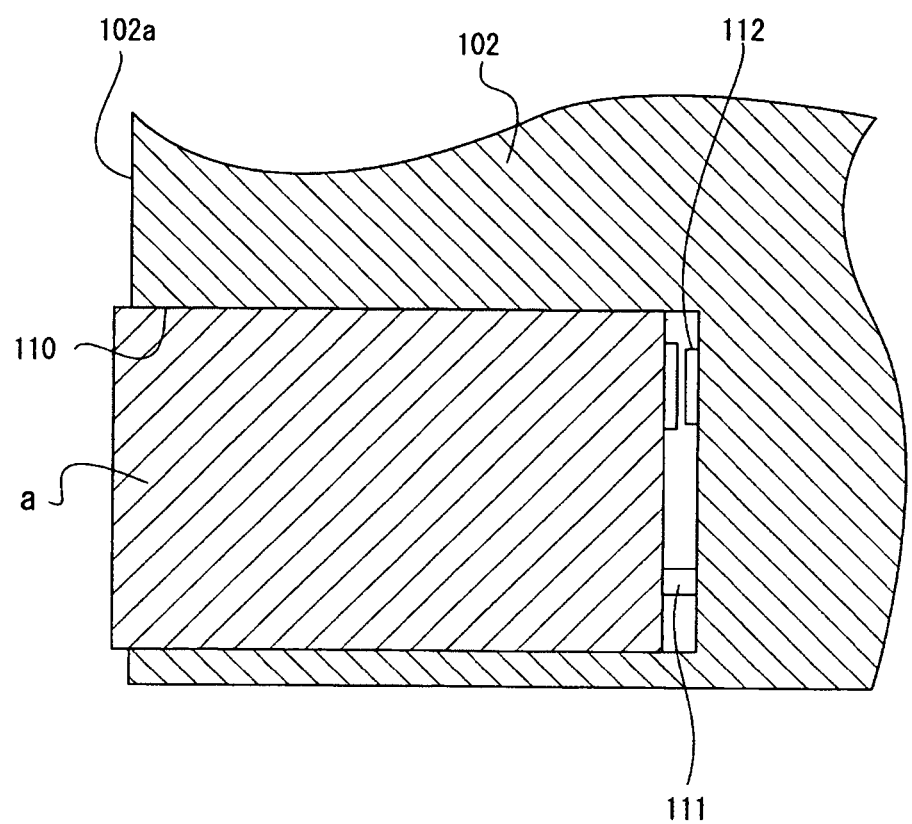
FIG. 8 is a conceptual diagram of a state in which a battery pack having no detectable recess is inserted into a battery installation part.

However, as shown in FIG. 7, there is also a battery pack "a" which is identical in size and shape of the battery pack 1 shown in FIG. 1. In the battery pack "a", the power that can be supplied is lower than that of the battery pack 1. The battery pack "a" does not have the detectable recess 2b. Accordingly, as shown in FIG. 8, when the battery pack "a" is inserted in the battery installation part 110, the detecting projection 111 touches a side face of the battery pack "a", so that insertion of the battery pack "a" into the battery installation part 110 is restricted. Since the detecting projection 111 touches the side face of the battery pack "a", the battery pack "a" cannot be inserted to an innermost end of the battery installation part 110, and the connector 3 is not connected to the connector 112 of the main unit 102, so that the battery pack "a" partially projects from the main unit 102.

Therefore, the battery pack "a" cannot be installed in the main unit 102. This allows a user to easily know that a wrong type of battery pack has been inserted.

By preventing misinsertion of a battery pack, a problem of data loss in an information processing device, such as a personal computer, can be avoided without causing a situation in which, when the battery pack "a", in which the power that can be supplied is lower, is installed in the battery installation part 110, which has large power consumption, the power unintentionally and suddenly turns off.

In addition, an electronic device having a main unit whose power consumption is smaller than that of the main unit 102 is not provided with a detecting projection. Either the battery pack "a" or the battery pack 1 can be inserted into the main unit of this electronic device.

Moreover, even in the case of designing battery packs, such as the battery pack 1 and the battery pack "a", which are identical in size and shape and are different in the power that can be supplied, only by providing a detecting projection on a main unit of an electronic device having larger power consumption, a battery pack which matches the magnitude of the required power consumption and which corresponds to the main unit can be installed without causing misinsertion. Therefore, in order to cope with a rise in power consumption of the electronic device, the number of cells in the battery pack does not need to be increased. In addition, enlargement of the battery pack and an increased weight of the electronic device, caused by an increased number of cells, can be avoided, and it is not necessary to make major changes in design of the battery installation part of the main unit.

Next, a communicating operation between the main unit 102 and the storing unit 5 of the battery pack 1 is described below with reference to FIG. 4.

When the power-on button 109 is pressed, the acquiring unit 114 detects the operation on the power-on button 109, and the operation of initiating activation of the electronic device 100 is performed and the acquiring unit 114 supplies power to the control unit 113. The value of the I/O port 116, which displays the mechanical ID of the battery pack 1, is read by the acquiring unit 114. The acquiring unit 114 acquires information stored in the battery pack 1, for example, power information (the power that can be supplied) configured in design, and transmits the acquired power information to the control unit 113.

After the electronic device 100 is activated, a system bus controller is initialized, and the address of the battery pack 1 is designated on the system bus. This confirms the existence of the battery pack 1. After confirming the existence of the battery pack 1, detection is performed concerning whether the battery pack 1 and the control unit 113 can communicate with each other.

After detecting that the battery pack 1 and the control unit 113 can communicate with each other, communication is initiated. The acquiring unit 114 acquires various types of information stored in the battery pack 1, for example, power information, and transmits the acquired power information to the control unit 113.

Based on the transmitted power information, the control unit 113 sets an optimal operating frequency of the main unit 102. Until the electronic device 100 is activated after the power-on button 109 is operated, based on the power information acquired from the value of the I/O port 116 which displays the mechanical ID, the optimal operating frequency of the main unit 102 is set by the control unit 113.

As described above, in the electronic device 100, the power information of the battery pack 1 is acquired from the storing unit 5 by the acquiring unit 114, and the operation of the main unit 102 is controlled by the control unit 113 based on the power information of the battery pack 1 acquired by the acquiring unit 114. Thus, for example, a problem of data loss in an information processing device, such as a personal computer, can be avoided without causing a situation in which the power unintentionally and suddenly turns off.

In addition, it is not necessary to provide a control circuit, such as a power saving circuit, in the main unit 102 in order to prevent the power from suddenly turns off. This can reduce the production cost required for the electronic device 100.

Cases in which the power information configured in design of the battery pack 1 and in which power information obtained when the electronic device 100 is activated have been described. However, the maximum power that can be supplied of the battery pack 1 to the main unit 102 sequentially changes in accordance with surrounding environments or a lapse of duration of use.

Figure 9:
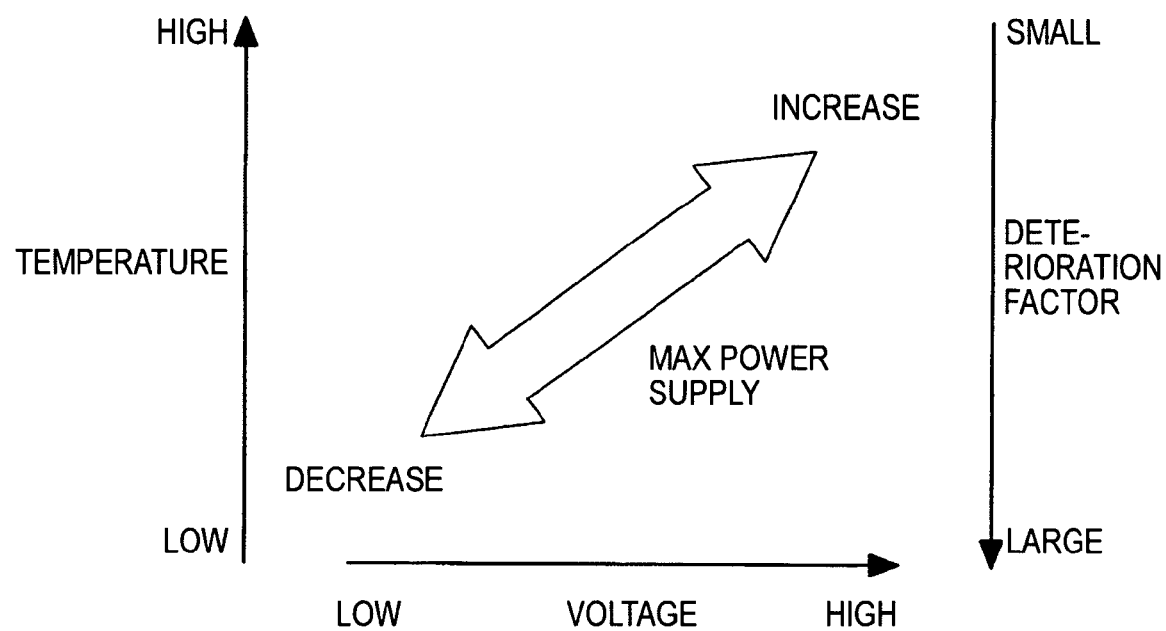
FIG. 9 is a graph showing relationships between the maximum power that can be supplied and each of parameters.

FIG. 9 is a graph showing relationships among the maximum power that can be supplied of the battery pack 1 and parameters.

As shown in FIG. 9, the maximum power that can be supplied of the battery pack 1 increases as an ambient temperature around the battery pack 1 increases. It increases as the voltage (cell voltage) of the battery pack 1 increases. It increases as a deterioration factor of the battery pack 1 decreases.

Accordingly, in the electronic device 100, by using the storing unit 5 of the battery pack 1, the maximum power that can be supplied is calculated based on constant detection of the ambient temperature, voltage, and deterioration factor, the calculated value is written in a storage area (RAM) of the storing unit 5, and the written power information is acquired and transmitted to the control unit 113 by the acquiring unit 114.

The acquisition and transmission of the power information by the acquiring unit 114 are continuously or intermittently performed when the electronic device 100 is activated. When the acquisition and transmission are intermittently performed, they are performed at intervals of, for example, eight seconds. Based on the continuously or intermittently transmitted power information, the control unit 113 changes the set optimal operating frequency each time and performs operation control of the main unit 102.

Therefore, in the electronic device 100, operation control can be optimized in response to a state of use on each occasion.

A case in which the main unit 102 is provided with the detecting projection 111 as a detecting part and the battery pack 1 is provided with the detectable recess 2b as a detectable part has been described. Conversely, the display unit 101 can be provided with a detecting recess as a detecting part and the battery pack 1 can be provided with a detectable projection as a detectable part.

The detecting part and the detectable part can be formed by, for example, optical or magnetic devices such as optical sensors or magnetic sensors without using mechanical parts such the detecting projection 111 as the detecting part and the detectable recess 2b as the detectable part.

Figure 10:
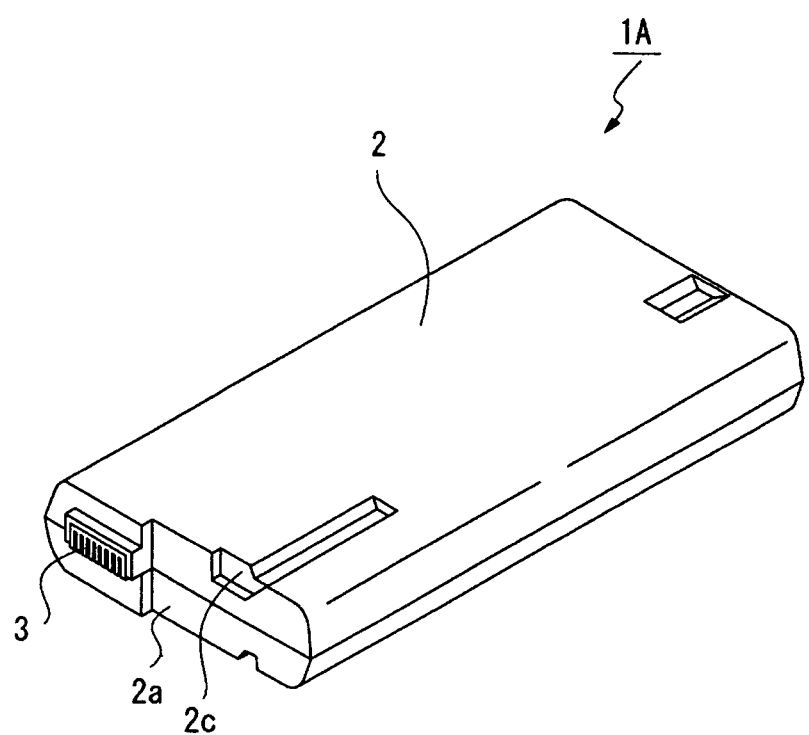
FIG. 10 is an enlarged perspective view of another battery pack in a different size.
Figure 11:
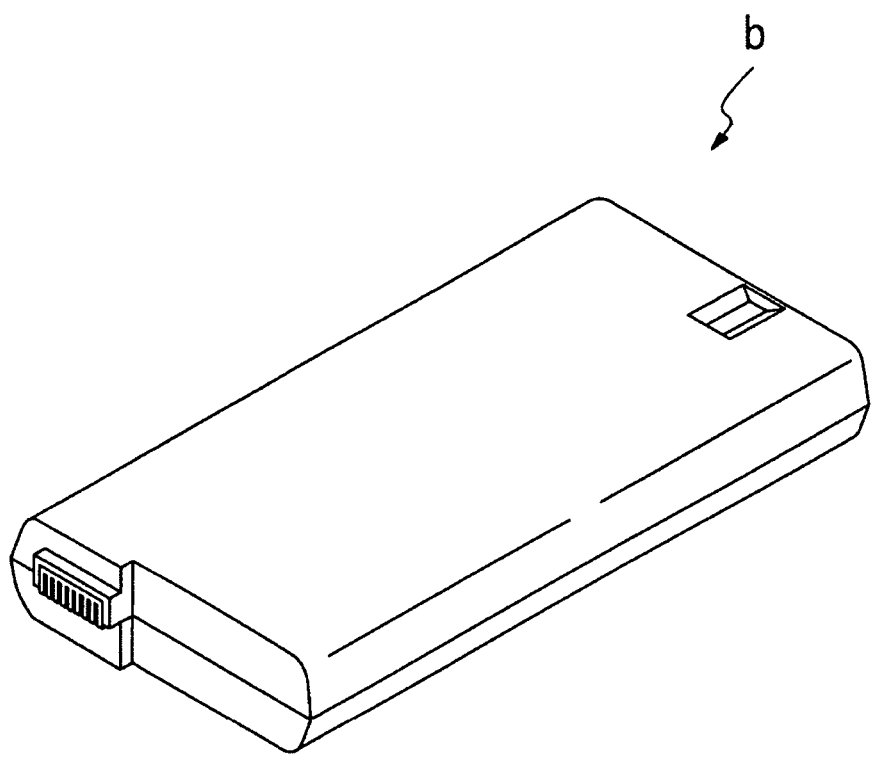
FIG. 11 is an enlarged perspective view of another battery pack in a different size which has no detectable recess.

The sizes and shapes of the battery pack 1 and the battery pack "a" are not limited to those shown in FIGS. 5 and 7. For example, the battery pack 1A shown in FIG. 10 and the battery pack "b" shown in FIG. 11, which are smaller in size than the battery pack 1 and the battery pack "a", are usable. In the battery pack 1A, the power that can be supplied is larger than that of the battery pack "b". The battery pack 1A is provided with a detectable recess 2C or a detectable projection, and the battery pack "b" is not provided with a detectable recess and a detecting projection.

The specific shapes and structures of the parts shown in the above embodiments are simple examples of embodying the present invention in practicing the present invention. Based on these, the technical scope of the present invention should not be interpreted in a limited manner.

What is claimed is:

1. An electronic device driven by power supplied from a battery pack installed in a main unit of said electronic device, comprising:
    storing means, provided in the battery pack, for storing power information of the battery pack, the power information including a maximum amount of power that can be delivered by the battery pack, the maximum amount of power that can be delivered by the battery pack being a maximum amount of energy per unit time that can be delivered by the battery pack;
    acquiring means, provided in the main unit, for acquiring the power information of the battery pack; and
    control means, provided in the main unit, for controlling the operation of the main unit based on the power information of the battery pack acquired by said acquiring means.

2. The electronic device according to claim 1, wherein the power information of the battery pack is regularly stored by said storing means, and the regularly stored power information is continuously or intermittently acquired by said acquiring means.

3. The electronic device according to claim 1, wherein the storing means also stores a remaining capacity of the battery and a load status of the battery.

4. The electronic device according to claim 1, wherein the control means sets an operation frequency of the electronic device based on the power information.

5. The electronic device according to claim 1, wherein the storage means calculates the maximum amount of power that can be delivered by the battery pack based on an ambient temperature, a voltage of the battery pack, and a deterioration factor of the battery pack.

6. An electronic device driven by power supplied from a battery pack installed in a main unit of said electronic device, wherein the battery pack has thereon a detectable part for enabling detection of the type of the battery pack; and the main unit has thereon a detecting part for reading the detectable part to detect the type of the battery pack; and the main unit comprises control means for controlling the operation of the main unit based on power information stored in the battery pack, whose type is detected, the power information including a maximum amount of power that can be delivered by the battery pack, the maximum amount of power that can be delivered by the battery pack being a maximum amount of energy per unit time that can be delivered by the battery pack.

7. The electronic device according to claim 6, wherein a housing for the battery pack has, on an outer surface thereof, one of a detectable projection and a detectable recess as the detectable part; and the main unit has, thereon, as the detecting part, one of a detecting recess into which the detectable projection is to be inserted and a detecting projection to be inserted into the detectable recess.

8. A battery pack for use in an electronic device comprising:
    a detecting part for detecting the type of the battery pack; and
    control means for performing operation control based on power information stored in the battery pack, whose type is detected, the battery pack supplying driving power to a main unit of the electronic device when being installed in the main unit of the electronic device, the power information including a maximum amount of power that can be delivered by the battery pack, the maximum amount of power that can be delivered by the battery pack being a maximum amount of energy per unit time that can be delivered by the battery pack,
    wherein the battery pack is provided with a detectable part by which the type of the battery pack is detected such that the detectable part is read by the detecting part when the battery pack is installed in the main unit of the electronic device.

9. The battery pack according to claim 8, wherein a housing for the battery pack has, on an outer surface thereof, one of a detectable projection or a detectable recess as the detectable part; and the type of the battery pack is detected such that a detecting projection provided as the detecting part of the main unit of the electronic device is inserted into the detectable recess, or the detectable projection is inserted into a detecting recess provided as the detecting part of the main unit of the electronic device.

10. An electronic device driven by power supplied from a battery pack installed in a main unit of said electronic device, comprising:
    a storage unit, provided in the battery pack, configured to store power information of the battery pack, the power information including a maximum amount of power that can be delivered by the battery pack, the maximum amount of power that can be delivered by the battery pack being a maximum amount of energy per unit time that can be delivered by the battery pack;

an acquiring unit, provided in the main unit, configured to acquire the power information of the battery pack; and a controller, provided in the main unit, configured to control the operation of the main unit based on the power information of the battery pack acquired by said acquiring unit.

11. The electronic device according to claim 10, wherein the power information of the battery pack is regularly stored by said storing unit, and the regularly stored power information is continuously or intermittently acquired by said acquiring unit.

* * * * *